(12) United States Patent
Lin et al.

(10) Patent No.: US 10,779,418 B2
(45) Date of Patent: Sep. 15, 2020

(54) MANUFACTURING METHOD OF DOUBLE LAYER CIRCUIT BOARD

(71) Applicant: Kinsus Interconnect Technology Corp., Taoyuan (TW)

(72) Inventors: Ting-Hao Lin, Taoyuan (TW); Chiao-Cheng Chang, Taoyuan (TW); Yi-Nong Lin, Taoyuan (TW)

(73) Assignee: KINSUS INTERCONNECT TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 16/555,261

(22) Filed: Aug. 29, 2019

(65) Prior Publication Data

US 2019/0387631 A1 Dec. 19, 2019

Related U.S. Application Data

(62) Division of application No. 15/864,754, filed on Jan. 8, 2018, now Pat. No. 10,440,837, which is a division of application No. 15/138,261, filed on Apr. 26, 2016, now Pat. No. 10,440,836.

(51) Int. Cl.
| | | |
|---|---|---|
| *H01K 3/10* | (2006.01) | |
| *H05K 3/42* | (2006.01) | |
| *H05K 1/02* | (2006.01) | |
| *H05K 1/11* | (2006.01) | |
| *H05K 3/00* | (2006.01) | |
| *H05K 3/46* | (2006.01) | |

(52) U.S. Cl.
CPC ............. *H05K 3/42* (2013.01); *H05K 1/0296* (2013.01); *H05K 1/112* (2013.01); *H05K 3/007* (2013.01); *H05K 1/0284* (2013.01); *H05K 3/4647* (2013.01); *H05K 2201/0376* (2013.01); *H05K 2203/0733* (2013.01); *H05K 2203/1476* (2013.01); *Y10T 29/49165* (2015.01)

(58) Field of Classification Search
CPC ....... H05K 3/4661; H05K 2201/09563; H05K 3/007; H05K 3/42; H05K 3/4602; H05K 3/4644; Y10T 29/49155; Y10T 29/49165
USPC .................................. 29/852, 825, 829, 846
See application file for complete search history.

(56) References Cited

U.S. PATENT DOCUMENTS 8,188,380 B2 * 5/2012 Kawai .................... H05K 1/113
174/262

* cited by examiner

*Primary Examiner* — Thiem D Phan
(74) *Attorney, Agent, or Firm* — Innovation Capital Law Group, LLP; Vic Lin

(57) ABSTRACT

A manufacturing method of a double layer circuit board comprises forming a connecting pillar on a first circuit, wherein the connecting pillar comprises a first end, connected to the first circuit, and a second end, opposite to the first end; forming a substrate on the first circuit and the connecting pillar; drilling the substrate to expose a portion of the second end of the connecting pillar, wherein the other portion of the second end of the connecting pillar is covered by the substrate; and forming a second circuit on the substrate and the portion of the second end of the connecting pillar, wherein an area of the first end connected to the first circuit layer is greater than an area of the portion of the second end connected to the second circuit layer.

18 Claims, 10 Drawing Sheets

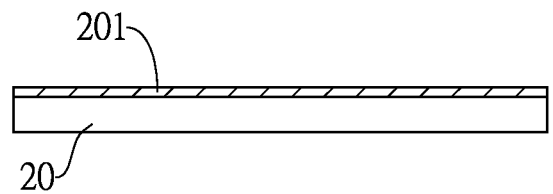
FIG.3A
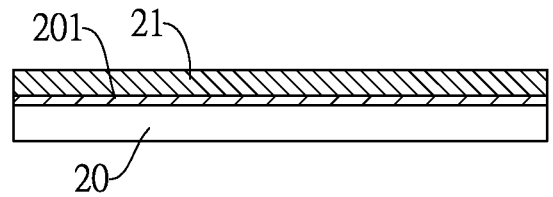
FIG.3B
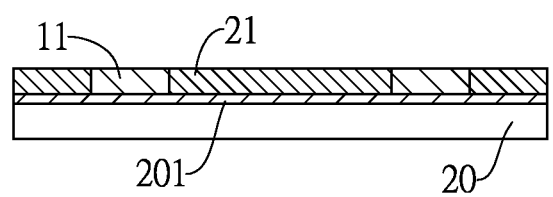
FIG.3C
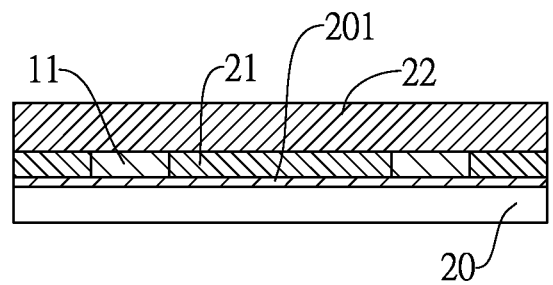
FIG.3D
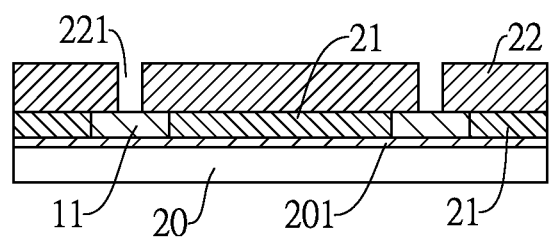
FIG.3E

MANUFACTURING METHOD OF DOUBLE LAYER CIRCUIT BOARD

CROSS-REFERENCE TO RELATED APPLICATIONS

This application is a divisional application claiming benefits of U.S. application Ser. No. 15/864,754 filed on 2018 Jan. 8, which is hereby incorporated by reference in their entirety.

BACKGROUND OF THE INVENTION

1. Field of the Invention

The present invention relates to a circuit board, and particularly to a manufacturing method of a double layer circuit board.

2. Description of the Related Art

With reference to FIG. 4, a conventional double layer circuit board comprises a substrate 30, and the substrate 30 comprises a first circuit 301, a second circuit 302, and at least one via 303. The first circuit 301 is formed on a first surface of the substrate 30, the second circuit 302 is formed on a second surface of the substrate 30, and the first surface is opposite to the second surface. The at least one via 303 is formed through the substrate 30 to connect the first surface and the second surface. At least one connecting pillar 304 that fills the at least one via 303 is formed by plating the at least one via 303 to connect the first circuit 301 and the second circuit 302.

With reference to FIGS. 5A-5H, a manufacturing method of the conventional double layer circuit board comprises the following steps.

In FIG. 5A, a substrate 30 is provided, wherein the substrate 30 comprises a first surface and a second surface, and the first surface is opposite to the second surface.

In FIG. 5B, at least one via 303 is formed to connect the first surface and the second surface of the substrate 30 by drilling the substrate 30 by laser.

In FIG. 5C, a first plating layer 31 is formed on the first surface of the substrate 30 and in the at least one via 303, and a second plating layer 32 is formed on the second surface of the substrate 30 and in the at least one via 303 to electronically connect to the first plating layer 31 in the at least one via 303.

In FIG. 5D, a first photoresist layer 41 is formed on the first surface of the substrate 30 to cover the first plating layer 31, and a second photoresist layer 42 is formed on the second surface of the substrate 30 to cover the second plating layer 32.

In FIG. 5E, the first photoresist layer 41 is patterned to form a groove of a first circuit pattern to expose the first plating layer 31 in the groove of the first circuit pattern, and the second photoresist layer 42 is patterned to form a groove of a second circuit pattern to expose the second plating layer 32 in the groove of the second circuit pattern.

In FIG. 5F, at least one connecting pillar 304 is formed by plating the first plating layer 31 and the second plating layer 32 in the at least one via 303 to fill the at least one via 303. A first circuit 301 is formed in the groove of the first circuit pattern by plating the exposed first plating layer 31, and a second circuit 302 is formed in the groove of the second circuit pattern by plating the exposed second plating layer 32.

In FIG. 5G, the first photoresist layer 41 and the second photoresist layer 42 are removed.

In FIG. 5H, a portion of the first plating layer 31 that is uncovered by the first circuit 301 and a portion of the second plating layer 32 that is uncovered by the second circuit 302 are removed.

The manufacturing method of the conventional double layer circuit board simultaneously forms the first circuit 301, the second circuit 302, and the at least one connecting pillar 304 by plating the first plating layer 31 and the second plating layer 32. When at least one connecting pillar 304 is formed, the first plating layer 31 and the second plating layer 32 in the at least one via 303 are plated to fill the at least one via 303, but the first circuit 301 and the second circuit 302 are respectively formed on the first surface and the second surface of the substrate 30 by plating the first plating layer 31 on the first surface and the second plating layer 32 on the second surface.

Since the first plating layer 31 and the second plating layer 32 are plated at a same time, a plating thickness of the plated first plating layer 31 and the plated second plating layer 32 on the first surface and the second surface is equal to the plating thickness of the plated first plating layer 31 and the plated second plating layer 32 in the at least one via 303.

When the plated first plating layer 31 and the plated second plating layer 32 in the at least one via 303 fill the at least one via 303 to form the at least one connecting pillar 304, the plated first plating layer 31 and the plated second plating layer 32 on the first surface and the second surface are plated for a specific plating thickness to form the first circuit 301 and the second circuit 302. A portion of the first circuit 301 and a portion of the second circuit 302 corresponding to the at least one via 303 are not plated for the specific plating thickness, since the at least one via 303 needs to be filled. Therefore, when the first circuit 301 and the second circuit 302 are formed, a depression 305 is formed on the portion of the first circuit 301 and the second circuit 302 corresponding to the at least one via 303. Further, since depth of the at least one via 303 corresponds to thickness of the substrate 30, the thicker the substrate 30 is, the deeper the at least one via 303 is. Therefore, the depression 305 formed in the portion of the first circuit 301 and the portion of the second circuit 302 corresponding to the at least one via 303 is conspicuous, when the thickness of the substrate 30 is thick.

The first circuit 301 and the second circuit 302 are electronically connected through the at least one connecting pillar 304 in the at least one via 303. Therefore, when the depression 305 is conspicuously formed, a connecting strength between the first circuit 301 and the second circuit 302 may be decreased, and a yield rate of the conventional double layer circuit board may be affected.

Besides, when the at least one connecting pillar 304 is formed, the first plating layer 31 and the second plating layer 32 are simultaneously plated, and the at least one via 303 is filled from two opposite sides. Therefore, an interspace may be easily formed in the at least one connecting pillar 304. An electronic connection between the first circuit 301 and the second circuit 302 is not good because of the interspace. Further, when the conventional double layer circuit board is in use, a temperature of the conventional double layer circuit board is raised, and air in the interspace is expanded. The conventional double layer circuit board may explode due to the expanded air and high pressure in the interspace. Therefore, manufacturing method of the conventional double layer circuit board should be improved.

SUMMARY OF THE INVENTION

An objective of the present invention is to provide a manufacturing method of a double layer circuit board. One of the manufacturing method of the double layer circuit board comprising:

forming a connecting pillar on a first circuit layer, wherein the connecting pillar comprises a first end, connected to the first circuit layer, and a second end, opposite to the first end;

forming a substrate on the first circuit layer and the connecting pillar;

drilling the substrate to expose a portion of the second end of the connecting pillar, wherein the other portion of the second end of the connecting pillar is covered by the substrate; and forming a second circuit layer on the substrate and the portion of the second end of the connecting pillar, wherein an terminal area of the first end connected to the first circuit layer is greater than an terminal area of the portion of the second end connected to the second circuit layer.

The substrate is formed to cover the at least one connecting pillar. Therefore, when a first circuit of the first circuit layer and a second circuit of the first circuit layer are formed on the first surface and the second surface of the substrate, the at least one connecting pillar is already formed, and the at least one via does not need to be filled. Then, a depression may not be formed in the portion of the first circuit and the second circuit corresponding to the at least one via, and the first circuit and the second circuit are electronically connected to the at least one connecting pillar. Therefore, regardless of a thickness of the substrate, the at least one connecting pillar is formed before the substrate is formed, and the depression may not be formed in the portion of the first circuit and the second circuit corresponding to the at least one connecting pillar.

Further, the at least one connecting pillar is not formed by simultaneously plating two plating layers, and an interspace may not be easily formed in the at least one connecting pillar. A yield rate of the double layer circuit board may be increased.

Other objectives, advantages and novel features of the invention will become more apparent from the following detailed description when taken in conjunction with the accompanying drawings.

DETAILED DESCRIPTION OF THE INVENTION

The present invention is a double layer circuit board and a manufacturing method thereof.

Figure 1:
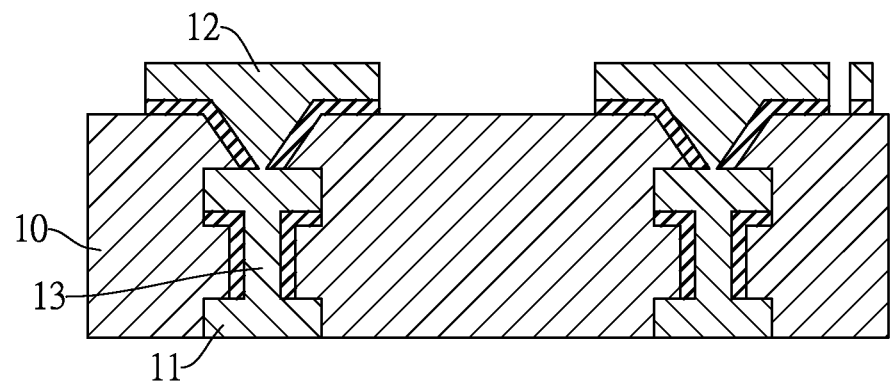
FIG. 1 is a sectional view of an embodiment of a double layer circuit board.

With reference to FIG. 1, the double layer circuit board comprises a substrate 10, a first circuit layer including a first circuit 11, a second circuit layer including a second circuit 12, and at least one connecting pillar 13.

The substrate 10 comprises a first surface and a second surface, and the first surface is opposite to the second surface.

The first circuit layer is formed on the first surface of the substrate 10.

The second circuit layer is formed on the second surface of the substrate 10.

The at least one connecting pillar 13 is formed in and covered by the substrate 10. Each one of the at least one connecting pillar 13 includes a first end and a second end, and the first end is opposite to the second end. The first end of the each one of the at least one connecting pillar 13 is connected to the first circuit 11. The second end of each one of the at least one connecting pillar 13 is connected to the second circuit 12.

The at least one first end and the at least one second end of the at least one connecting pillar 13 are respectively exposed out of the first surface and the second surface of the substrate 10. The first circuit 11 is formed on the first surface of the substrate 10 and connected to the at least one first end of the at least one connecting pillar 13, and the second circuit 12 is formed on the second surface of the substrate 10 and connected to the at least one second end of the at least one connecting pillar 13. Therefore, a depression may not be formed on a portion of the first circuit 11 and the second circuit 12 corresponding to the at least one connecting pillar 13.

Further, a terminal area of the at least one second end of the at least one connecting pillar 13 is greater than a terminal area of the at least one first end of the at least one connecting pillar 13. The terminal area of the at least one first end of the at least one connecting pillar 13 is a connecting area between the at least one connecting pillar 13 and the first circuit 11. A surface of the first circuit layer and the first surface of the substrate 10 are in a same plane, a plating layer is formed between the at least one connecting pillar 13 and the substrate 10, and another plating layer is formed between the second circuit 12 and the second surface of the substrate 10.

Therefore, when the second surface of the substrate 10 is drilled to expose the at least one second end of the at least one connecting pillar 13, a center of a hole drilled by laser is misaligned with a center of the at least one connecting pillar 13. A bottom of the hole drilled by laser may still expose the at least one second end of the at least one connecting pillar 13, and the second circuit 12 is firmly connected to the at least one second end of the at least one connecting pillar 13. Then, the second circuit 12 is firmly connected to the first circuit 11 through the at least one connecting pillar 13, and connecting strength between the first circuit layer and the second circuit layer is improved. A yield rate of the double layer circuit board is also improved.

Figure 2:
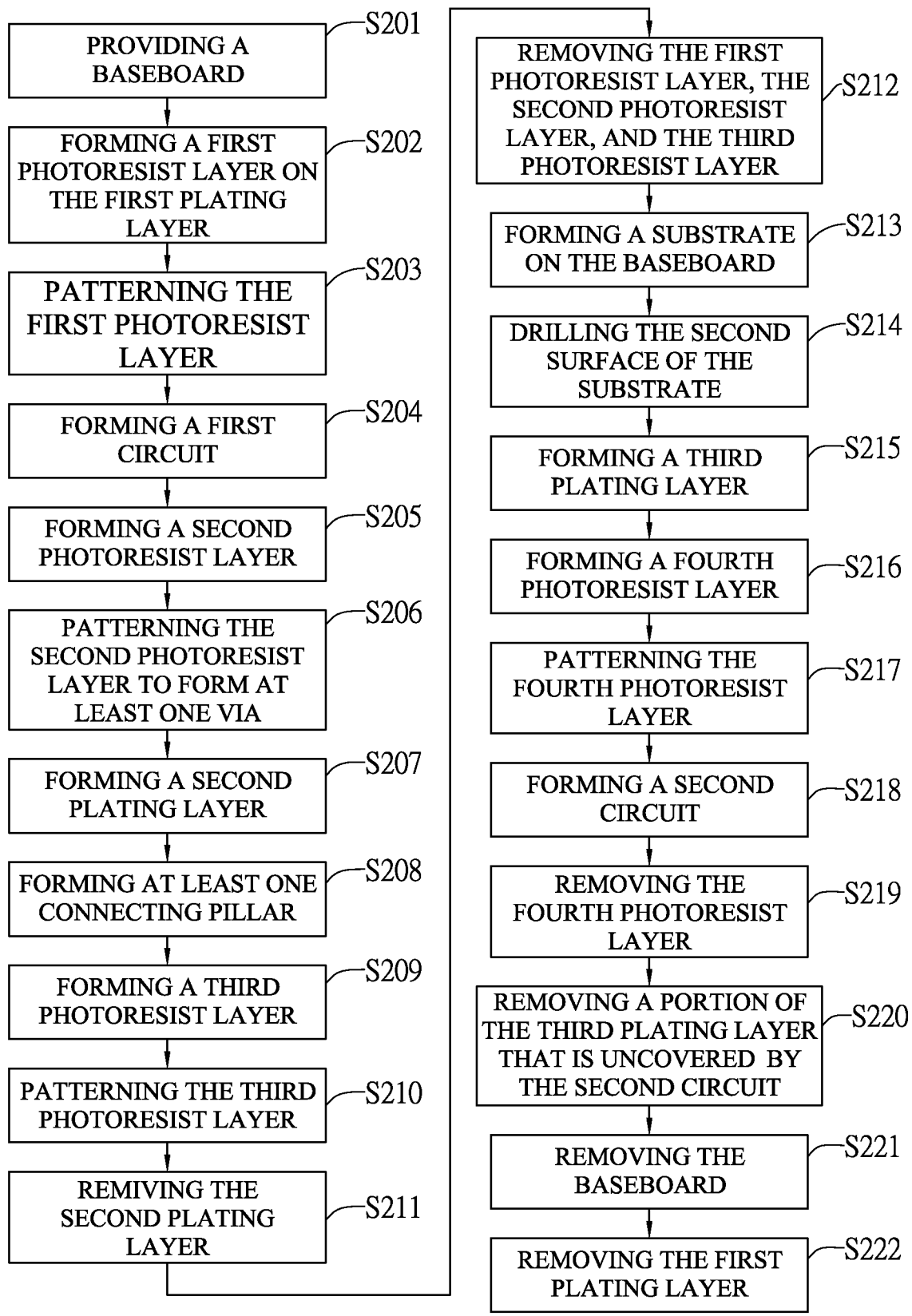
FIG. 2 is a flowchart of an embodiment of a manufacturing method of a double layer circuit board.

With reference to FIG. 2, the manufacturing method of the double layer circuit board comprises the following steps:

providing a baseboard (S201);

forming a first photoresist layer on the first plating layer (S202);

patterning the first photoresist layer (S203);

forming a first circuit (S204);

forming a second photoresist layer (S205);

patterning the second photoresist layer to form at least one via (S206);

forming a second plating layer (S207);

forming at least one connecting pillar (S208);

forming a third photoresist layer (S209);
patterning the third photoresist layer (S210);
removing a portion of the second plating layer that is uncovered by the third photoresist layer (S211);
removing the first photoresist layer, the second photoresist layer, and the third photoresist layer (S212);
forming a substrate on the baseboard (S213);
drilling the second surface of the substrate (S214);
forming a third plating layer (S215);
forming a fourth photoresist layer (S216);
patterning the fourth photoresist layer (S217);
forming a second circuit (S218);
removing the fourth photoresist layer (S219);
removing a portion of the third plating layer that is uncovered by the second circuit (S220);
removing the baseboard (S221);
removing the first plating layer (S222).

Figure 3F:
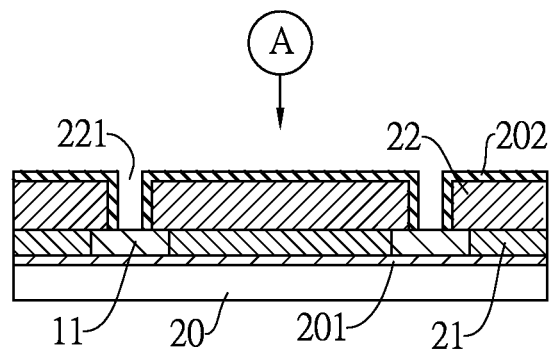
FIGS. 3A-3U are schematic views of an embodiment of manufacturing a double layer circuit board.
Figure 3G:
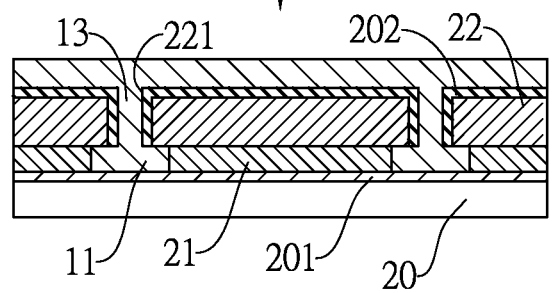
Figure 3H:
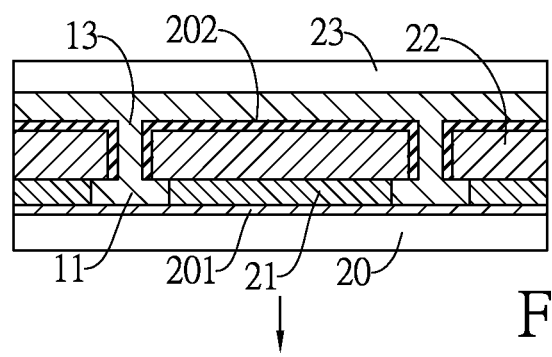
Figure 3I:
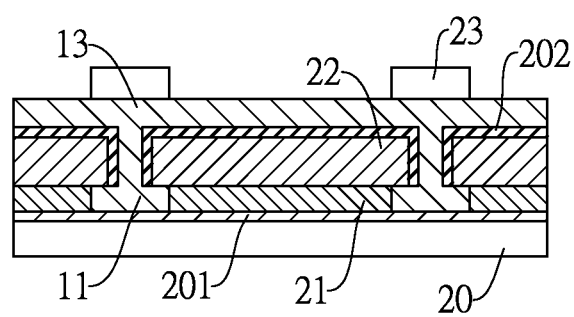
Figure 3J:
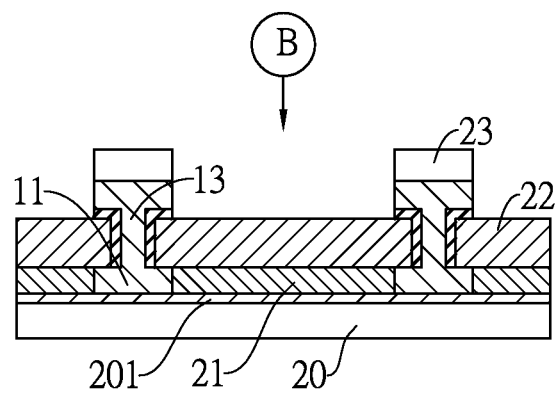
Figure 3K:
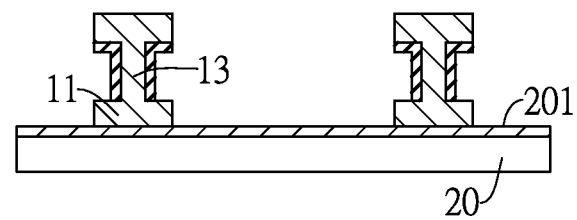
Figure 3L:
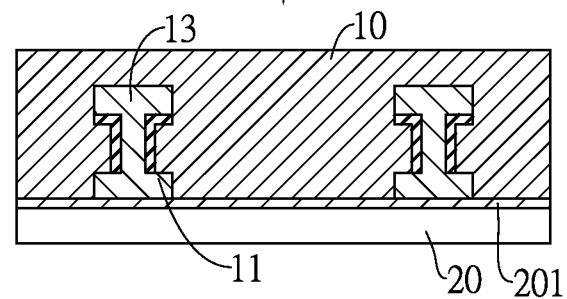
Figure 3M:
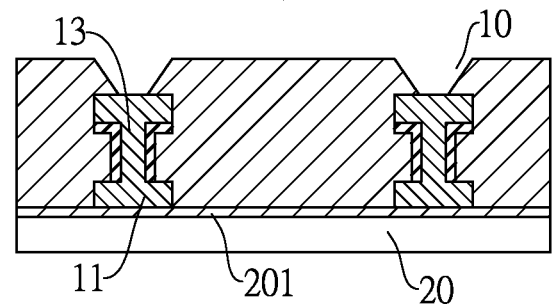
Figure 3N:
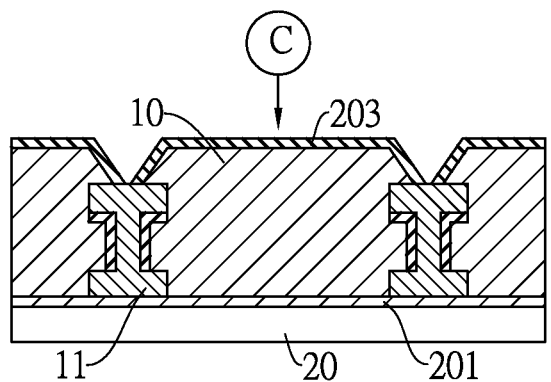
Figure 3O:
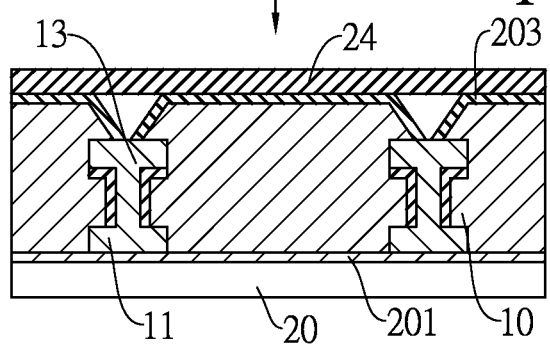
Figure 3P:
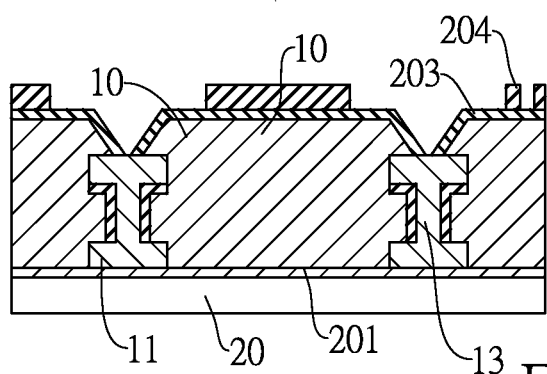
Figure 3Q:
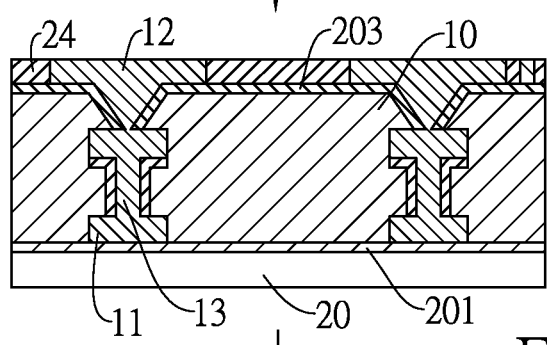
Figure 3R:
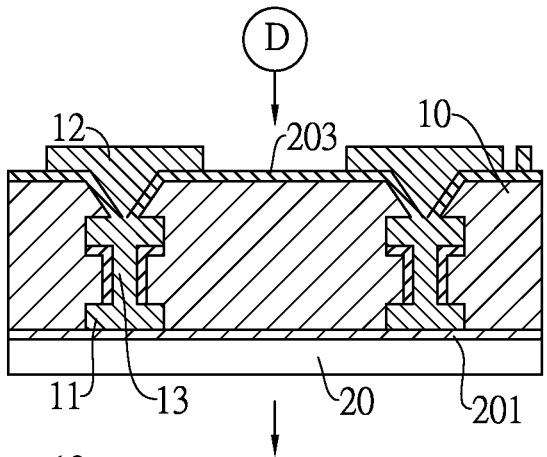
Figure 3S:
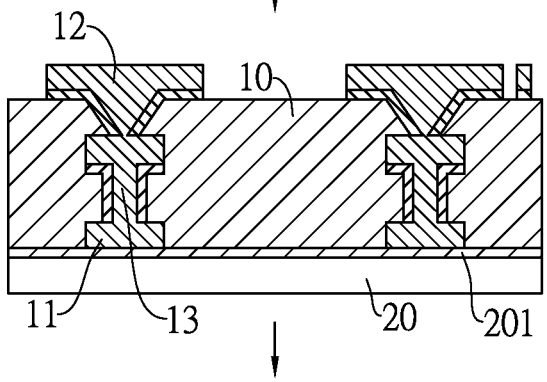
Figure 3T:
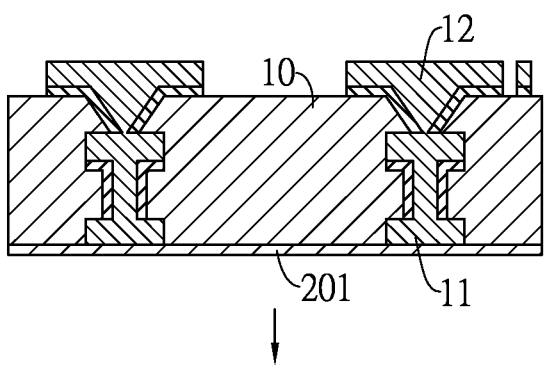
Figure 3U:
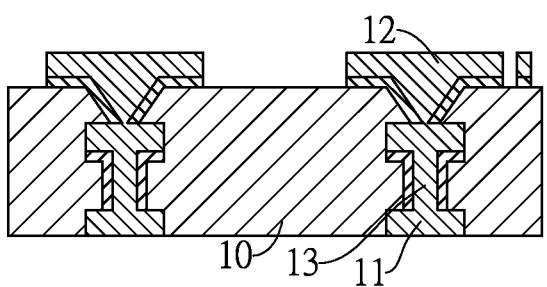
Figure 4:
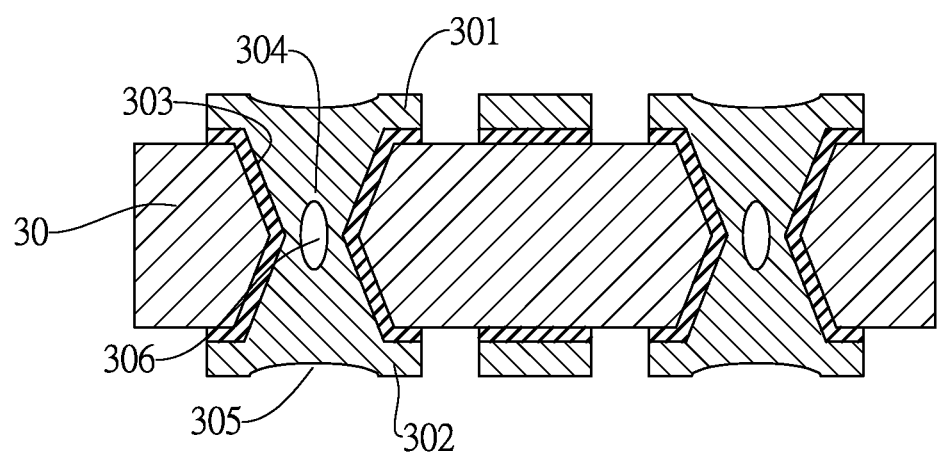
FIG. 4 is a sectional view of a conventional double layer circuit board.
Figure 5A:
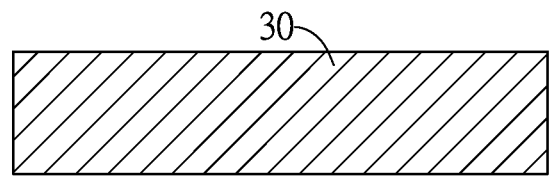
FIGS. 5A-5H are schematic views of manufacturing a conventional double layer circuit board.
Figure 5B:
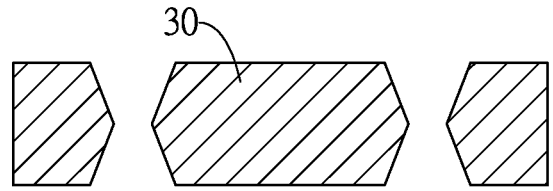
Figure 5C:
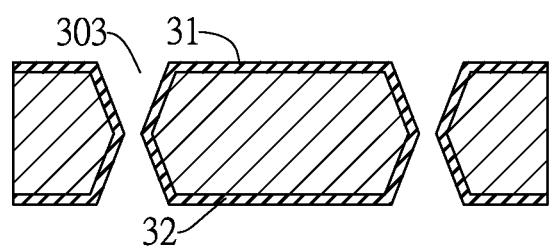
Figure 5D:
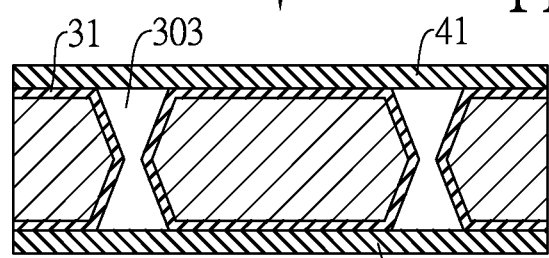
Figure 5E:
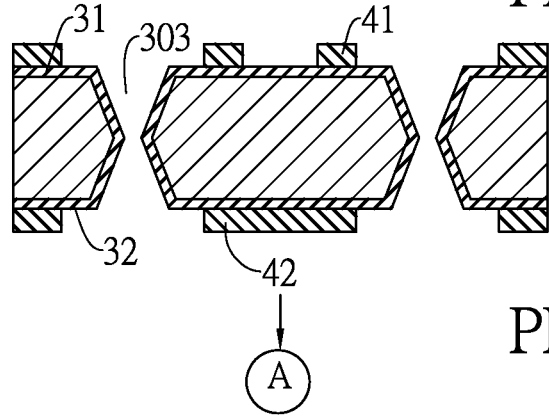
Figure 5F:
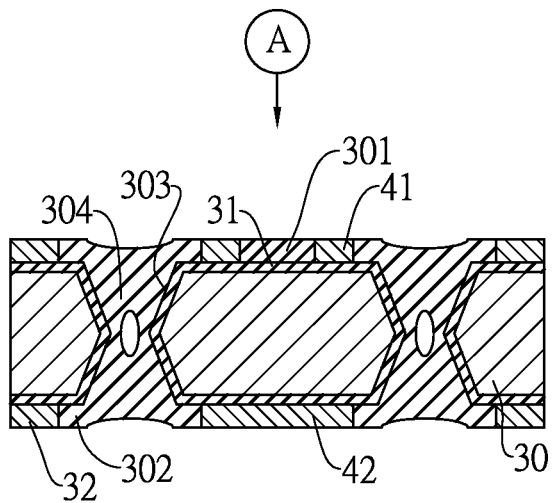
Figure 5G:
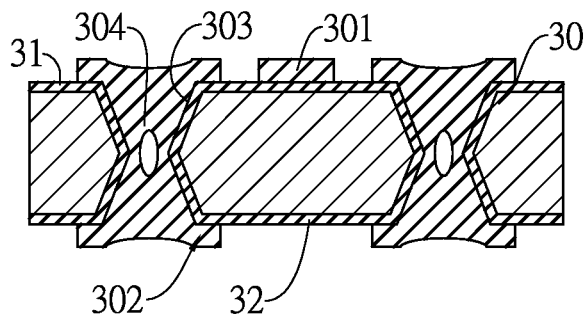
Figure 5H:
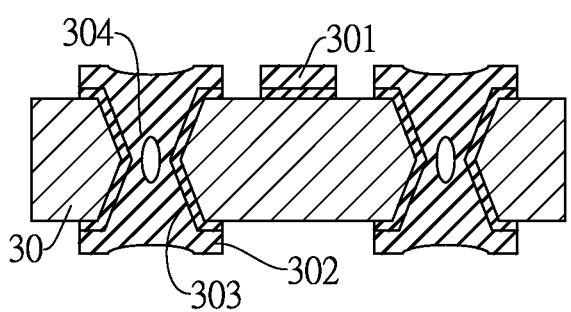

Further with reference to FIGS. 2 and 3A-3U, in FIG. 3A, as recited in the step (S201), a baseboard 20 is provided, and a first plating layer 201 is formed on a surface of the baseboard 20.

In FIG. 3B, as recited in the step (S202), a first photoresist layer 21 is formed on the first plating layer 201.

In FIG. 3C, as recited in the step (S203), the first photoresist layer 21 is patterned to form a groove of a first circuit pattern in the first photoresist layer 21. The first plating layer 201 is exposed in the groove of the first circuit pattern, and as recited in the step (S204), a first circuit 11 is formed in the groove of the first circuit pattern by plating the first plating layer 201 to fill the groove of the first circuit pattern.

In FIG. 3D, as recited in the step (S205), a second photoresist layer 22 is formed on the surface of the baseboard 20 to cover the first circuit 11 and the first photoresist layer 21.

In FIG. 3E, as recited in the step (S206), the second photoresist layer 22 is patterned to form at least one via 221 to expose a top surface of the first circuit 11.

In FIG. 3F as recited in the step (S207), a second plating layer 202 is formed on a surface of the second photoresist layer 22 and in the at least one via 221.

In FIG. 3G, as recited in the step (S208), at least one connecting pillar 13 that fills the at least one via 221 is formed by plating the second plating layer 202 in the at least one via 221. Each one of the at least one connecting pillar 13 comprises a first end and a second end, and the first end is opposite to the second end. The first end is connected to the first circuit 11.

In FIG. 3H, as recited in the step (S209), a third photoresist layer 23 is formed on the at least one connecting pillar 13 and the plated second plating layer 202.

In FIG. 3I, as recited in the step (S210), the third photoresist layer 23 is patterned to cover the at least one second end of the at least one connecting pillar 13.

In FIG. 3J, as recited in the step (S211), a portion of the second plating layer 202 that is uncovered by the third photoresist layer 23 is removed.

In FIG. 3K, as recited in the step (S212), the first photoresist layer 21, the second photoresist layer 22, and the third photoresist layer 23 are removed, and the first circuit 11 and the at least one connecting pillar 13 are maintained.

In FIG. 3L, as recited in the step (S213), a substrate 10 is formed on the baseboard 20 to cover the first circuit 11 and the at least one connecting pillar 13. The substrate 10 comprises a first surface and a second surface, and the first surface is opposite to the second surface. The first surface faces to the baseboard 20.

In FIG. 3M, as recited in the step (S214), the second surface of the substrate 10 is drilled by laser to expose the at least one second end of the at least one connecting pillar 13 out of the second surface of the substrate 10.

In FIG. 3N, as recited in the step (S215), a third plating layer 203 is formed on the second surface of the substrate 10. The third plating layer 203 is electronically connected to the at least one connecting pillar 13.

In FIG. 3O, as recited in the step (S216), a fourth photoresist layer 24 is formed on a surface of the third plating layer 203.

In FIG. 3P, as recited in the step (S217), the fourth photoresist layer 24 is patterned to form a groove of a second circuit pattern in the fourth photoresist layer 24. The third plating layer 203 is exposed in the groove of the second circuit pattern.

In FIG. 3Q, as recited in the step (S218), a second circuit 12 is formed in the groove of the second circuit pattern on the third plating layer 203 by plating the third plating layer 203.

In FIG. 3R, as recited in the step (S219), the fourth photoresist layer 24 is removed to expose the third plating layer 203, and the second circuit 12 is maintained to form a second circuit layer. A portion of the third plating layer 203 is uncovered by the second circuit 12.

In FIG. 3S, as recited in the step (S220), the portion of the third plating layer 203 that is uncovered by the second circuit 12 is removed.

In FIG. 3T, as recited in the step (S221), the baseboard 20 is removed.

In FIG. 3U, as recited in the step (S222), the first plating layer 201 is removed, and the first circuit 11 is maintained to form a first circuit layer.

When the first circuit 11 is formed on the baseboard 20, the at least one connecting pillar 13 is formed by the first photoresist layer 21, the second photoresist layer 22, and the third photoresist layer 23. The at least one connecting pillar 13 is formed before the substrate 10 is formed. When the substrate 10 is formed, the substrate 10 covers the at least one connecting pillar 13. The at least one connecting pillar 13 is not formed by filling at least one via of the substrate 10. When the first circuit 11 and the second circuit 12 are formed, no via of the substrate 10 needs to be filled, and no depression may be formed on a portion of the first circuit 11 and the second circuit 12 corresponding to the at least one connecting pillar 13.

Therefore, regardless of a thickness of the substrate 10, the at least one connecting pillar 13 is formed before the substrate 10 is formed, and no depression may be formed on the portion of the first circuit 11 and the second circuit 12 corresponding to the at least one connecting pillar 13.

Further, the at least one connecting pillar 13 is not formed by simultaneously plating two plating layers, and an interspace may not be easily formed in the at least one connecting pillar 13. A yield rate of the double layer circuit board may be increased, and the double layer circuit board may not explode when a temperature of the double layer circuit board is raised.

When the first to fourth photoresist layers 21, 22, 23, 24 are patterned, the first to fourth photoresist layers 21, 22, 23, 24 are processed by exposure and development to form specific patterns on the first to fourth photoresist layers 21, 22, 23, 24.

When the first to fourth photoresist layers 21, 22, 23, 24 are removed, the first to fourth photoresist layers 21, 22, 23, 24 are removed by stripper.

When the first to third plating layers 201, 202, 203 are removed, the first to third plating layers 201, 202, 203 are removed by etchant.

In the embodiment, the first to fourth photoresist layers 21, 22, 23, 24 are dry films.

In the embodiment, an area of the patterned third photoresist layer 23 covering the at least one connecting pillar 13 is greater than a section area of the at least one connecting pillar 13. Therefore, when the exposed and plated second plating layer 202 is removed, a terminal area of the at least one second end of the at least one connecting pillar 13 will be greater than a terminal area of the at least one first end of the at least one connecting pillar 13. The terminal area of the at least one first end of the at least one connecting pillar 13 is a connecting area between the at least one connecting pillar 13 and the first circuit 11.

Therefore, when the second surface of the substrate 10 is drilled by laser to expose the at least one second end of the at least one connecting pillar 13 and a center of a hole drilled is misaligned with a center of the at least one connecting pillar 13, a bottom of the hole drilled by laser may still expose the at least one second end of the at least one connecting pillar 13. The second circuit 12 is well connected to the at least one second end of the at least one connecting pillar 13. Then, the second circuit 12 is well connected to the first circuit 11 through the at least one connecting pillar 13, and a yield rate of the double layer circuit board may be increased.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A manufacturing method of a double layer circuit board comprising:
    forming a second plating layer directly contacted a first circuit layer and forming at least one via exposing the first circuit layer; wherein the first circuit layer includes a first circuit;
    forming a connecting pillar on the first circuit layer, wherein the connecting pillar comprises a first end, connected to the first circuit layer, and a second end, opposite to the first end; wherein the connecting pillar fills the at least one via, the second plating layer is between the connecting pillar and the substrate, the second plating layer contacts a section of a surface of the first circuit, the section does not contact the connecting pillar, and the first circuit directly contacts the connecting pillar;
    forming a substrate on the first circuit layer and the connecting pillar; wherein the substrate comprises a first surface and a second surface, the first surface is opposite to the second surface, and the first circuit is on the first surface of the substrate;
    drilling the substrate to expose a portion of the second end of the connecting pillar, wherein the other portion of the second end of the connecting pillar is covered by the substrate; and
    forming a second circuit layer on the substrate and the portion of the second end of the connecting pillar, wherein an terminal area of the first end connected to the first circuit layer is greater than an terminal area of the portion of the second end connected to the second circuit layer, and the second circuit layer includes a second circuit.

2. The manufacturing method of a double layer circuit board as claimed in claim 1, wherein in the step for drilling the substrate to expose a portion of the second end of the connecting pillar, the second surface of the substrate is drilled.

3. The manufacturing method of a double layer circuit board as claimed in claim 2, wherein the second circuit layer is formed on the second surface of the substrate.

4. The manufacturing method of a double layer circuit board as claimed in claim 1, wherein a bottom surface of the second plating layer contacting the first circuit and the terminal area of the first end of the connecting pillar contacting the first circuit are in a same plane.

5. The manufacturing method of a double layer circuit board as claimed in claim 1, further comprising a step for forming third plating layer on the second surface of the substrate and electronically connected to the at least one connecting pillar, before forming a second circuit layer on the substrate and the portion of the second end of the connecting pillar.

6. The manufacturing method of a double layer circuit board as claimed in claim 5, wherein the second plating layer does not contact the third plating layer.

7. The manufacturing method of a double layer circuit board as claimed in claim 1, wherein a center of a hole drilled on the second surface of the substrate is misaligned with a center of the connecting pillar.

8. The manufacturing method of a double layer circuit board as claimed in claim 7, a bottom of the hole exposes the second end of the connecting pillar.

9. A manufacturing method of a double layer circuit board comprising:
    forming a second plating layer directly contacted a first circuit layer and forming at least one via exposing the first circuit layer; wherein the first circuit layer includes a first circuit;
    forming a connecting pillar on the first circuit layer, wherein the connecting pillar comprises a first end, connected to the first circuit layer, and a second end, opposite to the first end;
    forming a substrate on the first circuit layer and the connecting pillar; wherein the substrate comprises a first surface and a second surface, the first surface is opposite to the second surface, and the first circuit is on the first surface of the substrate;
    drilling the substrate to expose a portion of the second end of the connecting pillar, wherein the other portion of the second end of the connecting pillar is covered by the substrate;
    forming a third plating layer on the second surface of the substrate and electronically connected to the at least one connecting pillar; and
    forming a second circuit layer on the substrate and the portion of the second end of the connecting pillar, wherein an terminal area of the first end connected to the first circuit layer is greater than an terminal area of the portion of the second end connected to the second circuit layer, the second circuit layer includes a second circuit, the third plating layer is between the second circuit and the second surface of the substrate, the third plating layer contacts a section of a surface of the second end of the connecting pillar, the section does not contact the second circuit, and the second circuit directly contacts the connecting pillar.

10. The manufacturing method of a double layer circuit board as claimed in claim 9, wherein in the step for drilling the substrate to expose a portion of the second end of the connecting pillar, the second surface of the substrate is drilled.

11. The manufacturing method of a double layer circuit board as claimed in claim 10, wherein the second circuit layer is formed on the second surface of the substrate.

12. The manufacturing method of a double layer circuit board as claimed in claim 9, wherein the connecting pillar fills the at least one via, the second plating layer is between the connecting pillar and the substrate, the second plating layer contacts a section of a surface of the first circuit, the section does not contact the connecting pillar, and the first circuit directly contacts the connecting pillar.

13. The manufacturing method of a double layer circuit board as claimed in claim 12, wherein a bottom surface of the second plating layer contacting the first circuit and the terminal area of the first end of the connecting pillar contacting the first circuit are in a same plane.

14. The manufacturing method of a double layer circuit board as claimed in claim 9, wherein the second plating layer does not contact the third plating layer.

15. The manufacturing method of a double layer circuit board as claimed in claim 9, wherein a bottom surface of the third plating layer contacting the terminal area of the second end of the connecting pillar and a bottom surface of the second circuit contacting the terminal area of the second end of the connecting pillar are in a same plane.

16. The manufacturing method of a double layer circuit board as claimed in claim 15, wherein the second plating layer does not contact the third plating layer.

17. The manufacturing method of a double layer circuit board as claimed in claim 9, wherein a center of a hole drilled on the second surface of the substrate is misaligned with a center of the connecting pillar.

18. The manufacturing method of a double layer circuit board as claimed in claim 17, a bottom of the hole exposes the second end of the connecting pillar.

* * * * *